US008278683B2

(12) United States Patent
Kawahara et al.

(10) Patent No.: US 8,278,683 B2
(45) Date of Patent: Oct. 2, 2012

(54) LATERAL INSULATED GATE BIPOLAR TRANSISTOR

(75) Inventors: Hideaki Kawahara, Tokyo (JP); Philip Leland Hower, Concord, MA (US)

(73) Assignee: Texas Instruments Incorporated, Dallas, TX (US)

(*) Notice: Subject to any disclaimer, the term of this patent is extended or adjusted under 35 U.S.C. 154(b) by 207 days.

(21) Appl. No.: 12/536,756

(22) Filed: Aug. 6, 2009

(65) Prior Publication Data

US 2010/0032713 A1 Feb. 11, 2010

Related U.S. Application Data

(60) Provisional application No. 61/086,650, filed on Aug. 6, 2008.

(51) Int. Cl.
*H01L 29/739* (2006.01)
*H01L 21/331* (2006.01)

(52) U.S. Cl. ........ 257/141; 257/258; 257/287; 257/355; 257/E29.197; 257/E21.382

(58) Field of Classification Search .................. 257/566, 257/41, 343, 355, E21.382, E29.197
See application file for complete search history.

(56) References Cited

U.S. PATENT DOCUMENTS

2008/0315251 A1* 12/2008 Lee ............................... 257/141
* cited by examiner

*Primary Examiner* — Mamadou Diallo
(74) *Attorney, Agent, or Firm* — Jacqueline J. Garner; Wade J. Brady, III; Frederick J. Telecky, Jr.

(57) ABSTRACT

Current density in an insulated gate bipolar transistor (L-IGBT) may be increased by adding a second gate, and the corresponding MOS transistors, to the source area, which increases the base current compared to a L-IGBT with a single MOS gate. The current density may be further increased by extending the base of the bipolar transistor in the L-IGBT vertically to the bottom surface of the silicon on insulator (SOI) film in which the L-IGBT is fabricated. Adding a buffer diffused region around the sinks in the source improves the base current spatial uniformity, which improves the safe operating area (SOA) of the L-IGBT. A L-IGBT of either polarity may be formed with the inventive configurations. A method of forming the inventive L-IGBT is also disclosed.

12 Claims, 16 Drawing Sheets

LATERAL INSULATED GATE BIPOLAR TRANSISTOR

FIELD OF THE INVENTION

This invention relates to the field of integrated circuits. More particularly, this invention relates to improved lateral insulated gate bipolar transistors in integrated circuits.

BACKGROUND OF THE INVENTION

Insulated gate bipolar transistors (IGBTs) offer a desirable combination of high current gain, high operating voltage and low on-state resistance. IGBTs in integrated circuits (ICs) are commonly configured as lateral insulated gate bipolar transistors (L-IGBTs) and fabricated using a planar process sequence to minimize cost and complexity of the IC manufacturing operation. Components in ICs, including LIGBTs, are shrinking with each new fabrication technology node, as articulated by Moore's Law, necessitating increases in current densities. Accordingly, an L-IGBT with increased current density capacity is desired.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

The instant invention provides a lateral insulated gate bipolar transistor (L-IGBT) with two or more metal oxide semiconductor (MOS) gates controlling three or more MOS transistor channels connected in parallel to the base of the bipolar transistor in the L-IGBT for the purpose of increasing base current. The base of the bipolar transistor extends from the surface of the L-IGBT to the bottom of the silicon on insulator (SOI) film in which the L-IGBT is fabricated. A buffer region is formed which surrounds the sinks in the source area of the L-IGBT, with a higher doping density than the base of the bipolar transistor. The L-IGBT may be of either polarity: a PNP bipolar transistor with a NMOS transistor connected to the PNP base, or an NPN bipolar transistor with a PMOS transistor connected to the NPN base. A method of forming the inventive L-IGBT in an integrated circuit is also claimed.

The combination of a vertically extended base and a source buffer region increases the uniformity of the base current and provides a higher current capacity for the L-IGBT.

DETAILED DESCRIPTION

Figure 1A:
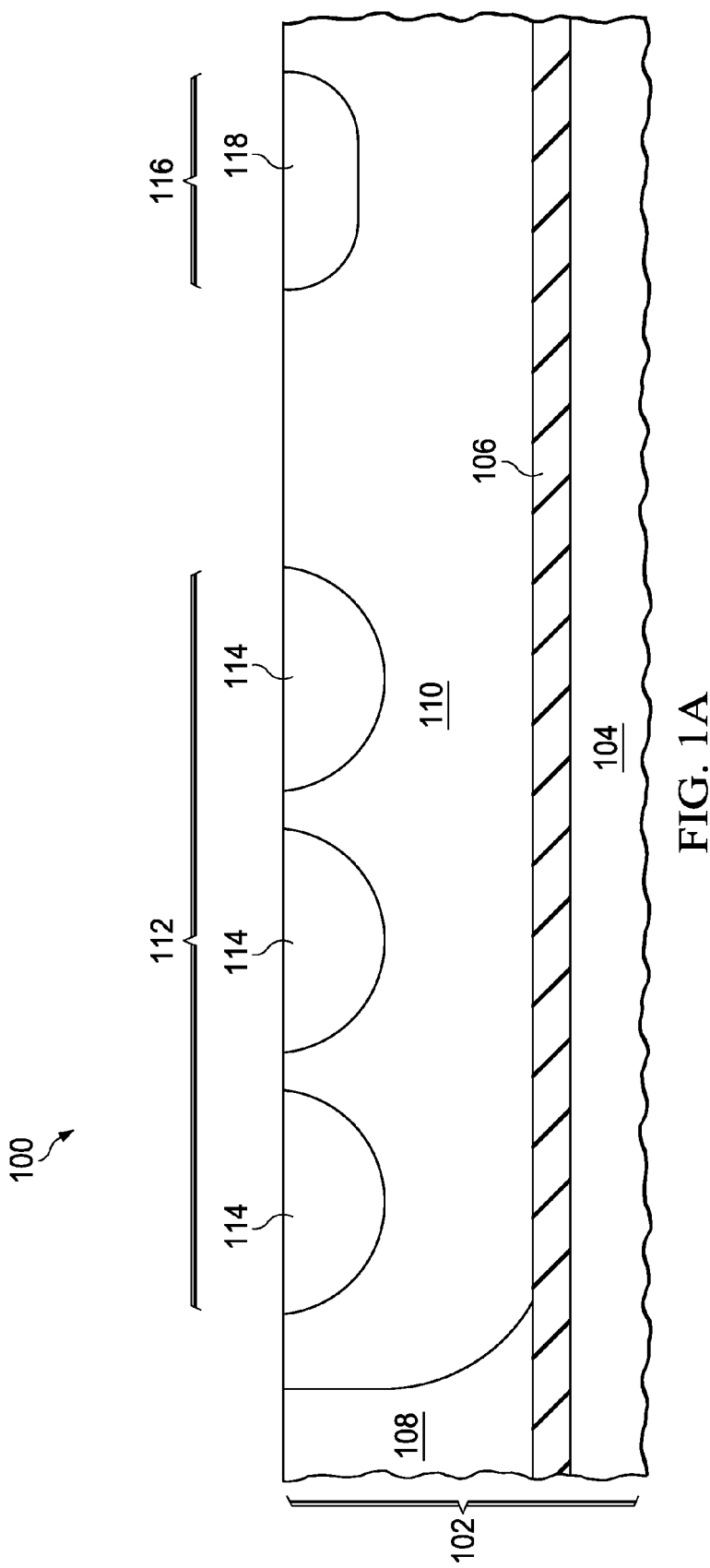
FIG. 1A through FIG. 1E are cross-sections of an IC, in successive stages of fabrication, containing an L-IGBT formed according to a first embodiment of the instant invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The need for higher current densities in lateral insulated gate bipolar transistors (L-IGBTs) in integrated circuits (ICs) is addressed by the instant invention, which provides a L-IGBT including multiple gates and n-type source regions configured in parallel to increase a base current to drive a PNP bipolar transistor in the L-IGBT. Gates may each control one or two metal oxide semiconductor (MOS) channels. A vertical dimension of an n-type drift region in the L-IGBT is enlarged to accommodate increased drain current densities without increasing a voltage drop across the n-type drift region. In a further embodiment, an n-type buffer region may be formed around source p-type regions to improve a spatial uniformity of injected hole current from a drain node in the n-type drift region.

FIG. 1A through FIG. 1E are cross-sections of an IC, in successive stages of fabrication, containing an L-IGBT formed according to a first embodiment of the instant invention. The instant embodiment includes two MOS gates, each of which control two MOS channels, and are thus referred to as dual channel MOS gates. Referring to FIG. 1A, the IC (100) is fabricated on a commercially available starting wafer (102), which includes a support wafer (104) which is commonly single crystal p-type silicon with an electrical resistivity above 50 ohm-cm, a buried oxide layer (106) which is typically silicon dioxide between 0.1 and 2 microns thick, formed on a top surface of the support wafer (104), and a single crystal silicon on insulator (SOI) film (108), typically silicon, commonly 50 nanometers to 10 microns thick, frequently p-type with an electrical resistivity between 1 and 100 ohm-cm, formed on a top surface of the buried oxide layer (106). It is common to grow single crystal silicon or silicon-germanium on a top surface of the single crystal SOI film (108) by epitaxial processes before fabricating components of the IC (100). In another embodiment, the starting wafer (102) may be a monolithic single crystal wafer. A region in the IC (100) defined for the L-IGBT is ion implanted with a first set of n-type dopants such as phosphorus and/or arsenic, typically at energies between 30 and 500 keV, typically at doses from $1 \cdot 10^{11}$ to $3 \cdot 10^{13}$ cm$^{-2}$, and annealed to form an n-type well (110) extending from a top surface of the single crystal SOI film (108) toward the buried oxide layer (106). In a preferred embodiment, the n-type well (110) extends to a top surface of the buried oxide layer (106).

Still referring to FIG. 1A, regions identified for p-type sinks in a source area (112) of the L-IGBT are ion implanted with a first set of p-type dopants such as boron and/or gallium, typically at energies between 10 and 200 keV, typically at doses from $3 \cdot 10^{12}$ to $1 \cdot 10^{15}$ cm$^{-2}$, and annealed to form p-type sinks (114) in the n-type well (110) extending from the top surface of the single crystal SOI film (108).

Still referring to FIG. 1A, a region identified for an n-type buffer in a drain area (116) of the L-IGBT is ion implanted with a second set of n-type dopants, such as phosphorus, arsenic and/or antimony, typically at energies between 30 and 500 keV, typically at doses from $1 \cdot 10^{13}$ to $5 \cdot 10^{15}$ cm$^{-2}$, and annealed to form an n-type buffer (118) in the n-type well (110) extending from the top surface of the single crystal SOI film (108).

It is within the scope of the instant invention to vary the order of formation of the p-type sinks (114) and the n-type buffer (118).

Figure 1B:
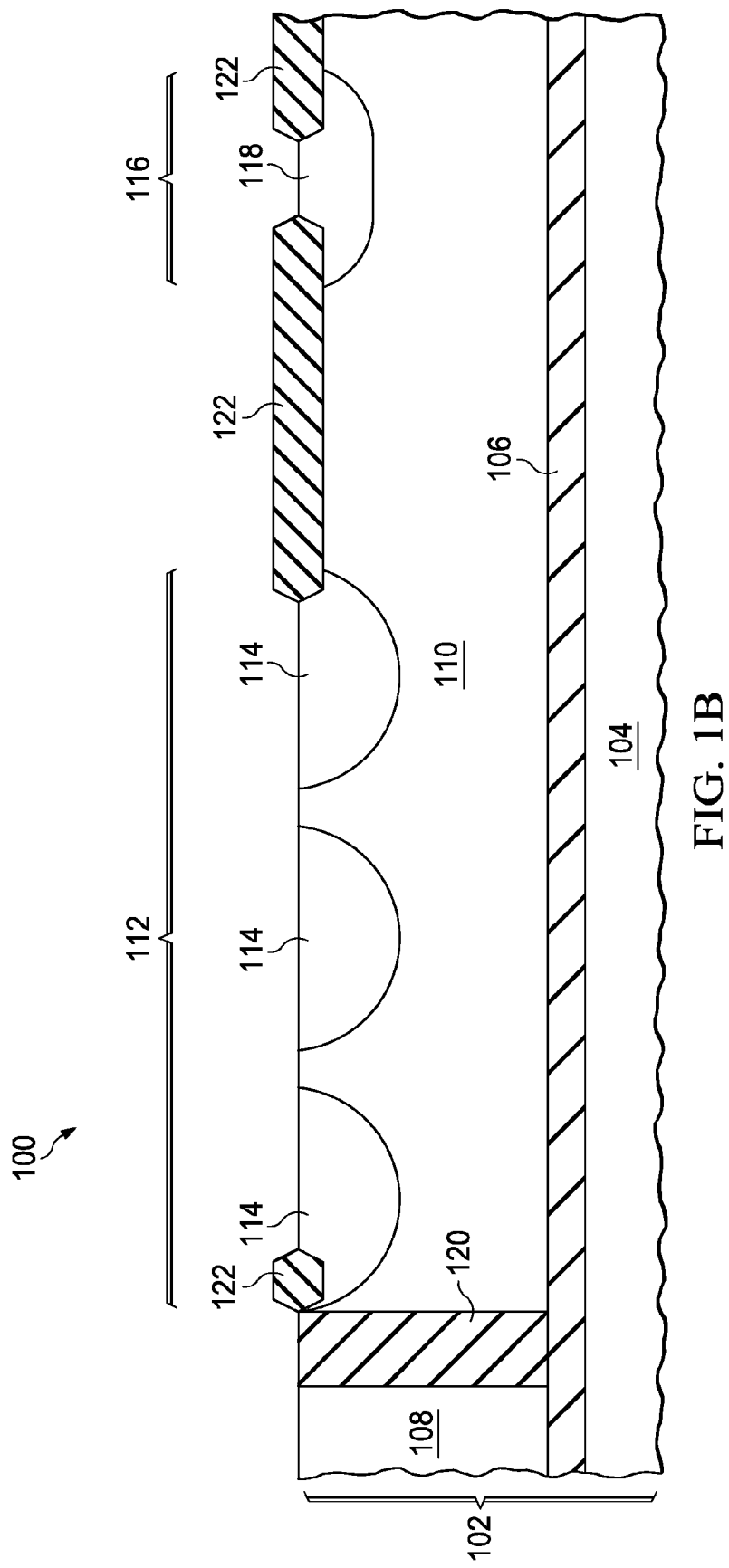

Referring to FIG. 1B, fabrication of the IC (100) continues with formation of elements of deep trench isolation (120) which extend from the top surface of the single crystal SOI film (108) to the buried oxide layer (106), and contain silicon dioxide, to provide electrical isolation between components in the single crystal SOI film (108). Deep trench isolation (120) is formed by etching a region of the single crystal SOI film (108) to expose the buried oxide layer (104) and depositing silicon dioxide in the etched region, according to known methods such as high aspect ratio process (HARP).

Still referring to FIG. 1B, regions of field oxide (122) are formed at the top surface of the single crystal SOI film (108) to provide electrical isolation between elements in the L-IGBT. Field oxide is formed of silicon dioxide, typically 200 to 600 nanometers thick, by known methods such as local oxidation of silicon (LOCOS) or shallow trench isolation (STI).

Figure 1C:
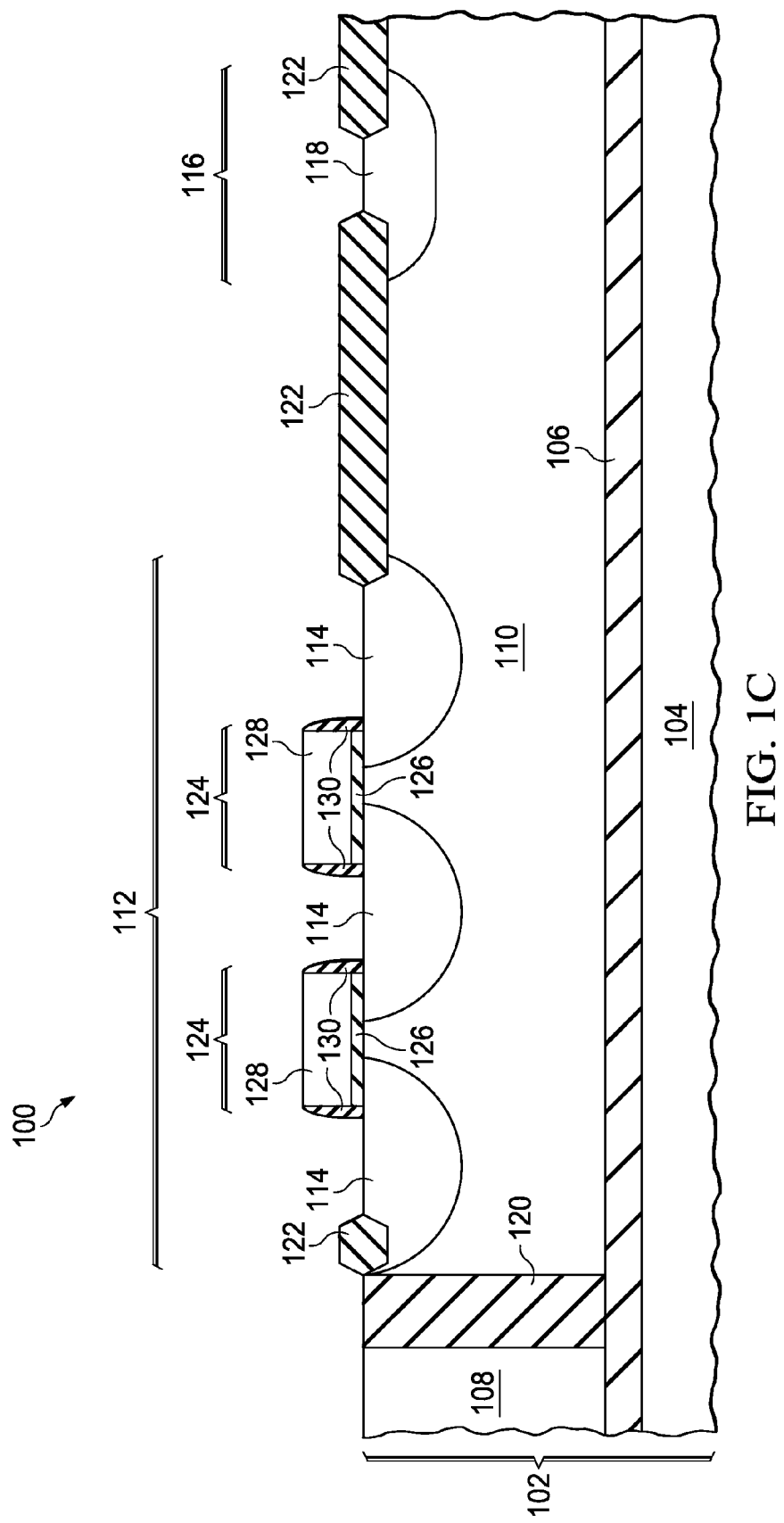

Referring to FIG. 1C, fabrication of the IC (100) continues with formation of MOS gate structures (124) on a top surface of the single crystal SOI film (108) in the source area (112) of the L-IGBT. Formation of the MOS gate structures (124) proceeds by formation of a gate dielectric layer (126), typically silicon dioxide, nitrogen doped silicon dioxide, silicon oxy-nitride, hafnium oxide, layers of silicon dioxide and silicon nitride, or other insulating material, commonly 5 to 100 nanometers thick, on a top surface of the single crystal SOI film (108) over regions between adjacent p-type sinks (114) and overlapping portions of the p-type sinks (114). Gate material, typically polycrystalline silicon, commonly called polysilicon, between 100 and 1000 nanometers thick, is formed on a top surface of the gate dielectric layer (126). Regions for the MOS gates (128) are defined on a top surface of the gate material by a first photoresist pattern, and unwanted gate material is removed by etching to form the MOS gates (128). Typically, gate sidewall spacers (130) are formed on lateral surfaces of the MOS gates (128) to provide lateral separation of MOS source diffused regions from the MOS gates (128). The gate sidewall spacers (130) are commonly formed by depositing between 50 and 500 nanometers of one or more sidewall dielectric materials such as silicon dioxide and silicon nitride on the MOS gates (128) followed by an anisotropic etch which removes the sidewall dielectric materials from a top surface of the MOS gates (128) and the top surface of the single crystal SOI film (108), leaving sidewall dielectric materials on the lateral surfaces of the MOS gates (128) to form the gate sidewall spacers (130), which are typically 20 to 500 nanometers thick.

Figure 1D:
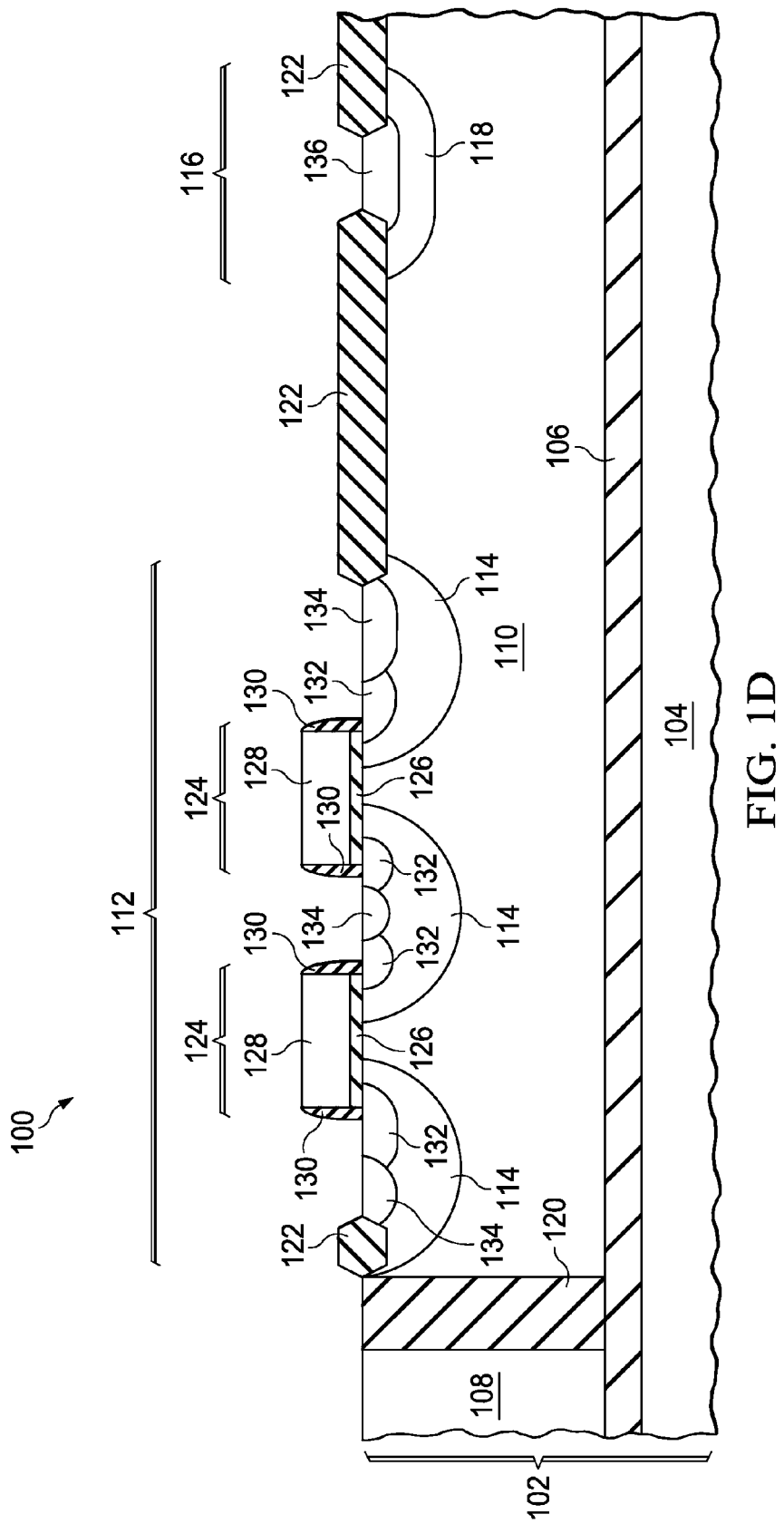

Referring to FIG. 1D, fabrication of the IC (100) continues with formation of n-type MOS source diffused regions (132) at top surfaces of the p-type sinks (114) adjacent to the gate sidewall spacers (130), typically by ion implanting a third set of n-type dopants, such as phosphorus, arsenic and/or antimony, typically at energies between 50 and 250 keV, typically at total doses from $3 \cdot 10^{13}$ to $3 \cdot 10^{16}$ cm$^{-2}$.

Still referring to FIG. 1D, p-type source contact regions (134) are formed at top surfaces of the p-type sinks (114) adjacent to the n-type MOS source diffused regions (132), typically by ion implanting a second set of p-type dopants, such as boron, BF$_2$ and/or gallium, typically at energies between 30 and 300 keV, typically at total doses from $3 \cdot 10^{13}$ to $3 \cdot 10^{16}$ cm$^{-2}$. Similarly, one or more p-type drain contact regions (136) is formed at a top surface of the n-type buffer (118) in an open region surrounded by field oxide (122), typically by ion implanting a second set of p-type dopants, such as boron, BF$_2$ and/or gallium, typically at energies between 30 and 300 keV, typically at total doses from $3 \cdot 10^{13}$ to $3 \cdot 10^{16}$ cm$^{-2}$. It is common to form the p-type source contact regions (134) and the p-type drain contact regions (136) in the same set of process steps.

It is within the scope of this invention to vary the order of formation of the of n-type MOS source diffused regions (132), the p-type source contact regions (134) and the p-type drain contact regions (136).

Figure 1E:
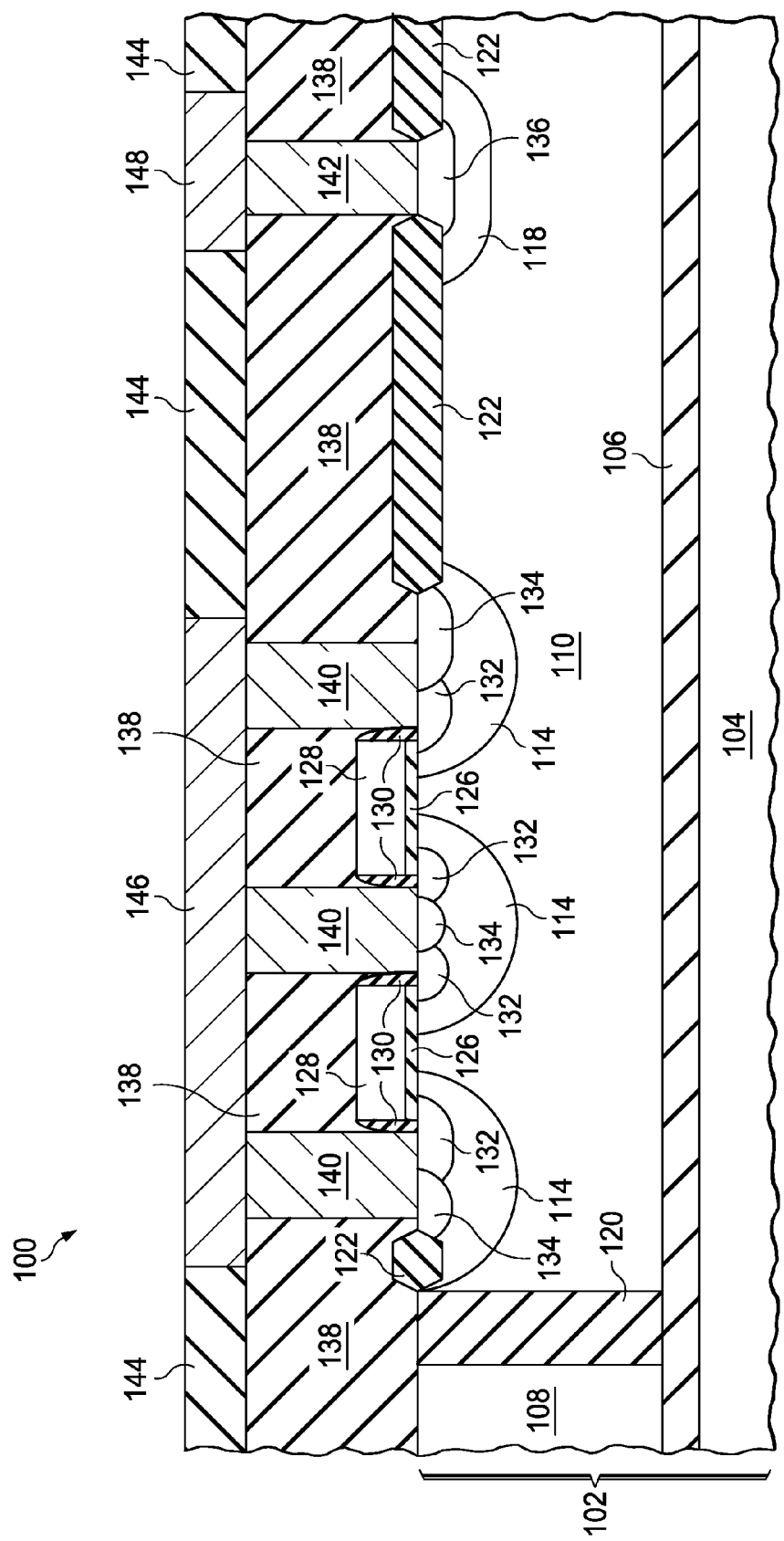

Referring to FIG. 1E, following formation of the n-type MOS source diffused regions (132), the p-type source contact regions (134) and the p-type drain contact regions (136), fabrication of the IC (100) continues with formation of elements of a system of interconnects that provide electrical connections between the L-IGBT and other components in the IC (100). A pre-metal dielectric (PMD) layer stack (138), which typically includes a PMD liner of silicon nitride, silicon dioxide, silicon oxy-nitride or a combination these materials, between 10 and 100 nanometers thick, a silicon dioxide, phospho-silicate glass (PSG) or boro-phospho-silicate glass (BPSG) layer between 400 and 1000 nanometers thick, is formed on the top surface of the n-type well (100), p-type sinks (114), n-type buffer (118) and field oxide (122). Metal contacts are formed in the PMD layer stack (138) and extend from a top surface of the PMD layer stack (138) to contact regions in the L-IGBT. Contacts are formed by defining regions for contacts with a second photoresist pattern, forming contact holes by removing PMD layer stack (138) material by known etching methods to expose the top surface of the contact regions of the L-IGBT, and depositing a metal or metals, commonly platinum, tungsten, titanium-tungsten and/or aluminum, in the contact holes and on the top surface of the PMD layer stack (138), followed by selective removal of the metals from the top surface of the PMD layer stack (138), commonly by etching and/or chemical mechanical polishing (CMP). In this manner, source contacts (140) are formed that make electrical connections to the n-type MOS source diffused regions (132) and the p-type source contact regions (134). Similarly, drain contacts (142) are formed that make electrical connections to the p-type drain contact regions (136). Gate contacts, not shown in FIG. 1E, are formed that make electrical connections to the MOS gates (128).

Still referring to FIG. 1E, a first set of metal interconnects and a first intra-metal dielectric layer (144) is formed on a top surface of the PMD layer stack (138). The first intra-metal dielectric layer (144) may be formed primarily of silicon dioxide, fluoro-silicate glass (FSG), or any of several dielectric materials with a lower dielectric constant than silicon dioxide, such as organo-silicate glass (OSG), carbon-doped silicon oxides (SiCO or CDO) or methylsilsesquioxane (MSQ), collectively end known as low-k dielectrics. The first set of metal interconnects may be formed of aluminum or copper. A source metal lead (146) makes electrical contact to the top surfaces of the source contacts (140). Similarly, a drain metal lead (148) makes electrical contact to the top surfaces of the drain contacts (142). A gate metal lead, not shown in FIG. 1E, makes electrical contact to the top surfaces of the gate contacts.

The p-type drain contact regions (136) form an emitter of a PNP bipolar transistor, hereafter referred to simply as the emitter, the n-type well (110) forms a base of the PNP bipolar transistor, hereafter referred to simply as the base, and the p-type source contact regions (134) form a collector of the PNP bipolar transistor, hereafter referred to simply as the collector. The n-type MOS source diffused regions (132) form sources of n-channel MOS (NMOS) transistors, the MOS gates (128) form gates of the NMOS transistors, and regions the n-type well (110) under the MOS gates (128) adjacent to the p-type sinks (114) form drains of the NMOS transistors, which are connected to the base. Thus, each MOS gate (128) controls two channels in parallel, one at each edge of the MOS gate, and so these MOS gates (128) are referred to as dual channel MOS gates.

During operation of the L-IGBT, a positive emitter voltage is applied to the emitter through the drain metal lead (148) with respect to the collector. Gate voltages above an NMOS threshold voltage allow base current to flow through the NMOS transistors, which modulates collector current between the drain metal lead (148) and the source metal lead (146), which is connected to the collector.

The formation of more than one MOS gate in the instant embodiment is advantageous because more base current is provided to the PNP bipolar transistor, which provides more collector current density, than L-IGBT configurations with one MOS gate.

Furthermore, the formation of the n-type well (110) such that it extends throughout a majority of the single crystal SOI film (108) in the region defined for the L-IGBT is advantageous because it provides a reduced voltage drop for collector current in the base compared to L-IGBT configurations with more constricted base regions.

Figure 2:
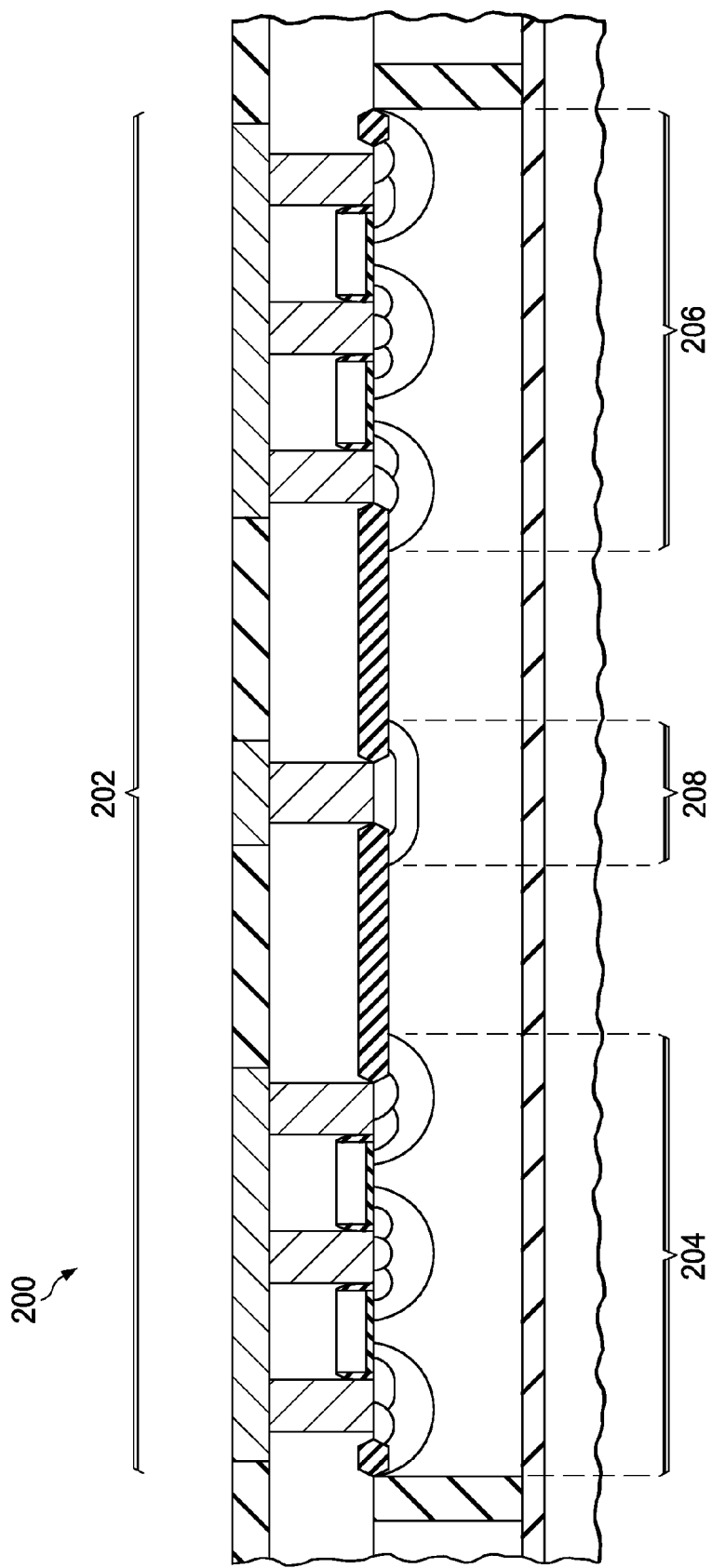
FIG. 2 depicts a symmetric embodiment of the instant invention.

In an alternate embodiment, a symmetric L-IGBT is formed, as shown in FIG. 2, with source areas on each side of the drain area, so that the L-IGBT is symmetric with respect to the drain area. Referring to FIG. 2, an IC (200) includes an L-IGBT (202), which contains a left source area (204) and a right source area (206) and a central drain area (208). Elements in the left and right source areas (204, 206) correspond to elements in the source area discussed in reference to FIG. 1A through FIG. 1E above. Similarly, elements in the drain area (208) correspond to elements in the drain area discussed in reference to FIG. 1A through FIG. 1E above.

Figure 3A:
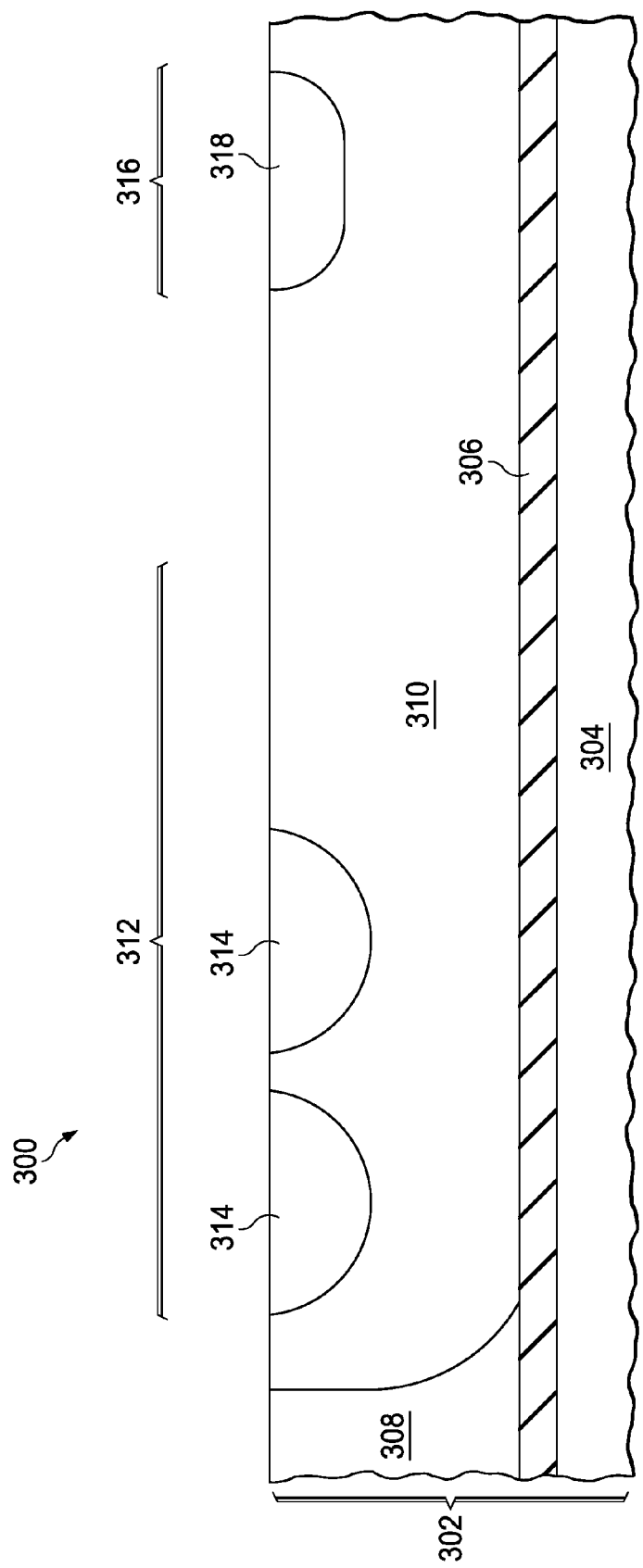
FIG. 3A through FIG. 3E are cross-sections of an IC, in successive stages of fabrication, containing an L-IGBT formed according to an alternate embodiment of the instant invention.

FIG. 3A through FIG. 3E are cross-sections of an IC, in successive stages of fabrication, containing an L-IGBT formed according to an alternate embodiment of the instant invention. The instant embodiment includes two MOS gates, one being a dual channel MOS gate which controls two MOS channels and the other being a single channel MOS gate which controls one MOS channel. Referring to FIG. 3A, the IC (300) is fabricated on a commercially available starting wafer (302), which includes a support wafer (304) which is commonly single crystal p-type silicon with an electrical resistivity above 50 ohm-cm, a buried oxide layer (306) which is typically silicon dioxide between 0.1 and 2 microns thick, formed on a top surface of the support wafer (304), and a single crystal silicon on insulator (SOI) film (308), typically silicon, commonly 50 nanometers to 10 microns thick, frequently p-type with an electrical resistivity between 1 and 100 ohm-cm, formed on a top surface of the buried oxide layer (306). It is common to grow single crystal silicon or silicon-germanium on a top surface of the single crystal SOI film (308) by epitaxial processes before fabricating components of the IC (300). In another embodiment, the starting wafer (302) may be a monolithic single crystal wafer. A region in the IC (300) defined for the L-IGBT is ion implanted with a first set of n-type dopants such as phosphorus and/or arsenic, typically at energies between 30 and 500 keV, typically at doses from $1\cdot10^{11}$ to $3\cdot10^{13}$ cm$^{-2}$, and annealed to form an n-type well (310) extending from a top surface of the single crystal SOI film (308) toward the buried oxide layer (306). In a preferred embodiment, the n-type well (310) extends to a top surface of the buried oxide layer (306).

Still referring to FIG. 3A, regions identified for p-type sinks in a source area (312) of the L-IGBT are ion implanted with a first set of p-type dopants such as boron and/or gallium, typically at energies between 10 and 200 keV, typically at doses from $3\cdot10^{12}$ to $1\cdot10^{15}$ cm$^{-2}$, and annealed to form p-type sinks (314) in the n-type well (310) extending from the top surface of the single crystal SOI film (308).

Still referring to FIG. 3A, a region identified for an n-type buffer in a drain area (316) of the L-IGBT is ion implanted with a second set of n-type dopants, such as phosphorus, arsenic and/or antimony, typically at energies between 30 and 500 keV, typically at doses from $1\cdot10^{13}$ to $5\cdot10^{15}$ cm$^{-2}$, and annealed to form an n-type buffer (318) in the n-type well (310) extending from the top surface of the single crystal SOI film (308).

In a preferred embodiment, there is another source area, not shown in FIG. 3A through FIG. 3E for clarity, on the other side of the drain area, so that the L-IGBT is symmetric with respect to the drain area.

It is within the scope of the instant invention to vary the order of formation of the p-type sinks (314) and the n-type buffer (318).

Figure 3B:
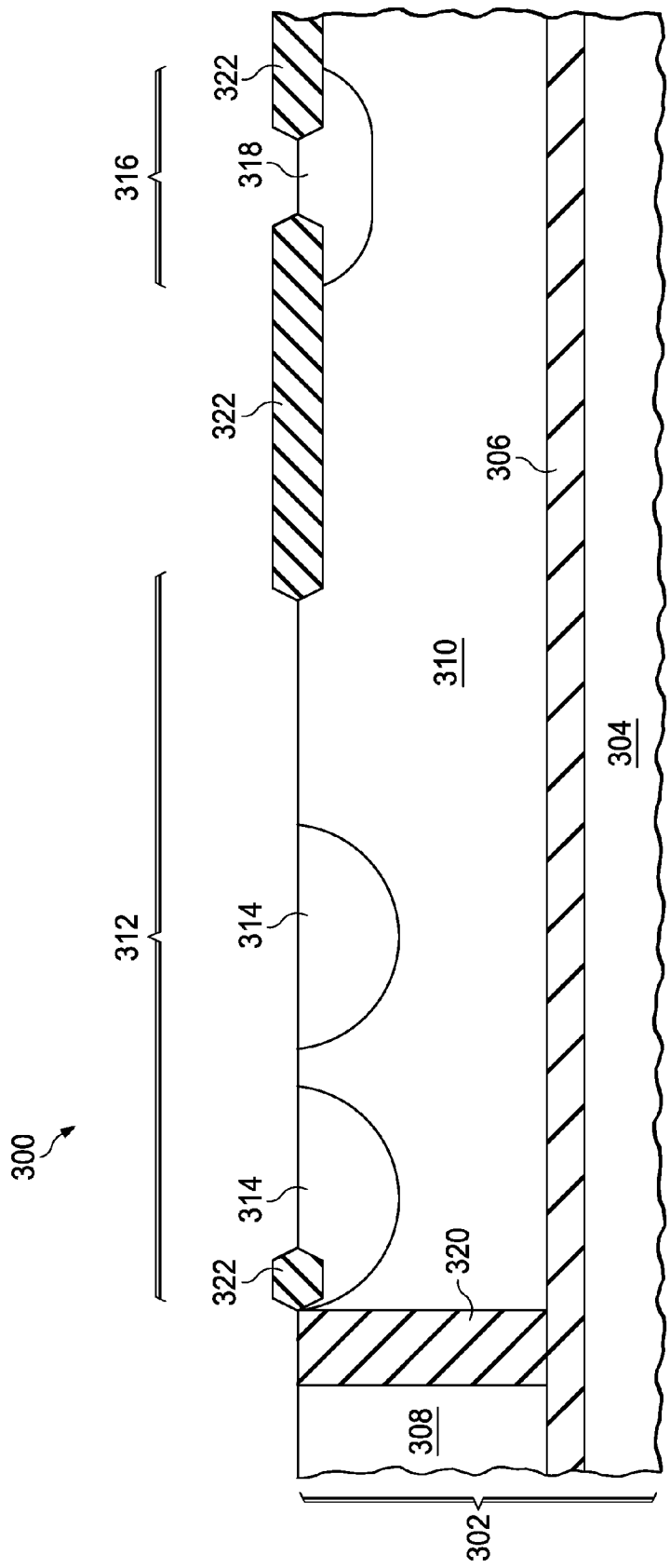

Referring to FIG. 3B, fabrication of the IC (300) continues with formation of elements of deep trench isolation (320) which extend from the top surface of the single crystal SOI film (308) to the buried oxide layer (306), and contain silicon dioxide, to provide electrical isolation between components in the single crystal SOI film (308). Deep trench isolation (320) is formed by etching a region of the single crystal SOI film (308) to expose the buried oxide layer (304) and depositing silicon dioxide in the etched region, according to known methods such as HARP.

Still referring to FIG. 3B, regions of field oxide (322) are formed at the top surface of the single crystal SOI film (308) to provide electrical isolation between elements in the L-IGBT. Field oxide is formed of silicon dioxide, typically 200 to 600 nanometers thick, by known methods such as local oxidation of silicon (LOCOS) or shallow trench isolation (STI).

Figure 3C:
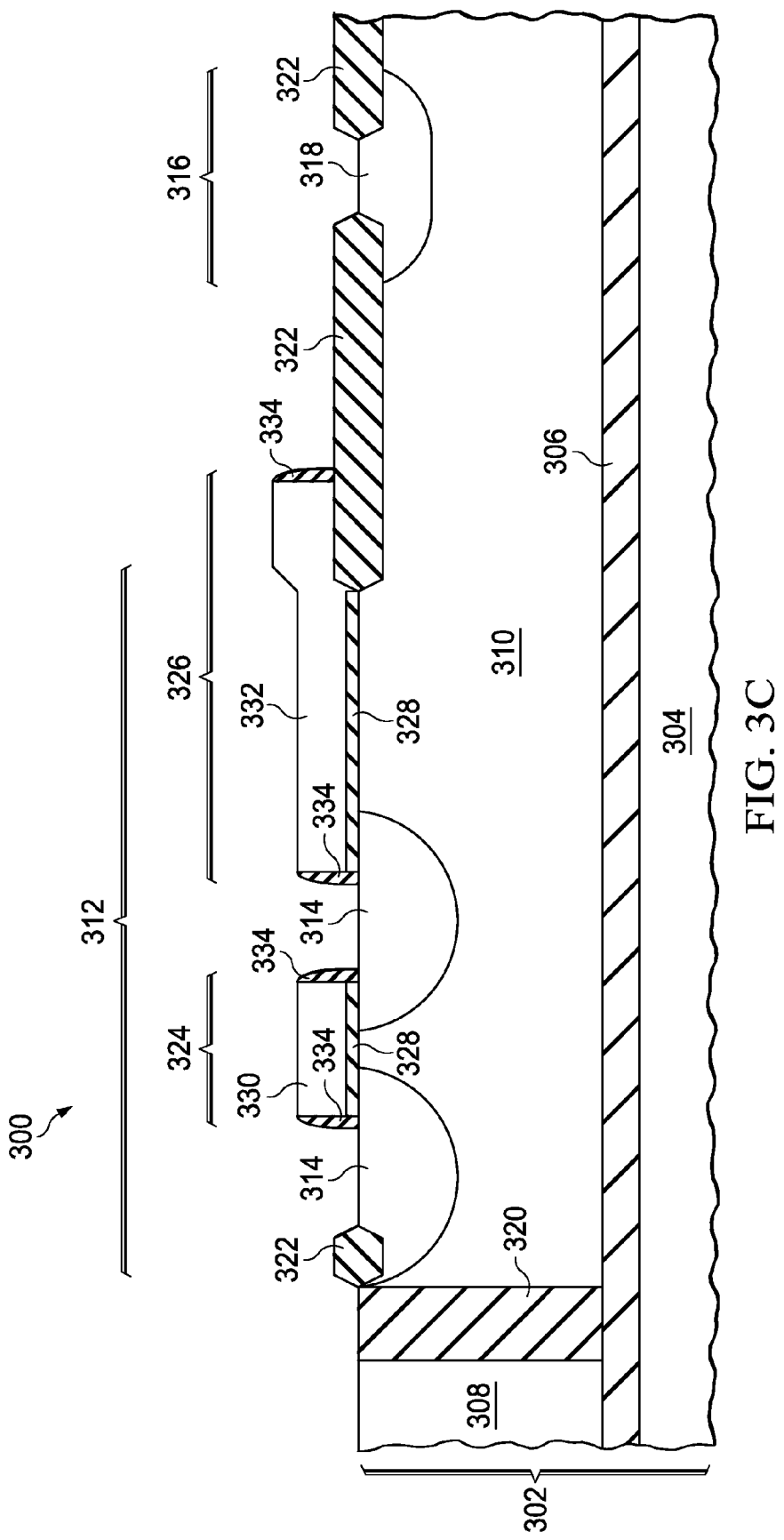

Referring to FIG. 3C, fabrication of the IC (300) continues with formation of a dual channel MOS gate structure (324) and a single channel MOS gate structure (326) on a top surface of the single crystal SOI film (308) in the source area (312) of the L-IGBT. Formation of the MOS gate structures (324, 226) proceeds by formation of a gate dielectric layer (328), typically silicon dioxide, nitrogen doped silicon dioxide, silicon oxy-nitride, hafnium oxide, layers of silicon dioxide and silicon nitride, or other insulating material, commonly 5 to 100 nanometers thick, on a top surface of the single crystal SOI film (308) over regions adjacent to the p-type sinks (314) and overlapping portions of the p-type sinks (314). Gate material, typically polysilicon between 100 and 1000 nanometers thick, is formed on a top surface of the gate dielectric layer (328). Regions for the dual channel MOS gate (330) and the single channel MOS gate (332) are defined on a top surface of the gate material by a first photoresist pattern, and unwanted gate material is removed by etching to form the MOS gates (330, 232). Typically, gate sidewall spacers (334) are formed on lateral surfaces of the MOS gates (330, 232) to provide lateral separation of MOS source diffused regions from the MOS gates (330, 232). The gate sidewall spacers (334) are commonly formed by depositing between 50 and 500 nanometers of one or more sidewall dielectric materials such as silicon dioxide and silicon nitride on the MOS gates (330, 232) followed by an anisotropic etch which removes the sidewall dielectric materials from a top surface of the MOS gates (330, 232) and the top surface of the single crystal SOI film (308), leaving sidewall dielectric materials on the lateral surfaces of the MOS gates (330, 232) to form the gate sidewall spacers (334), which are typically 20 to 500 nanometers thick.

Figure 3D:
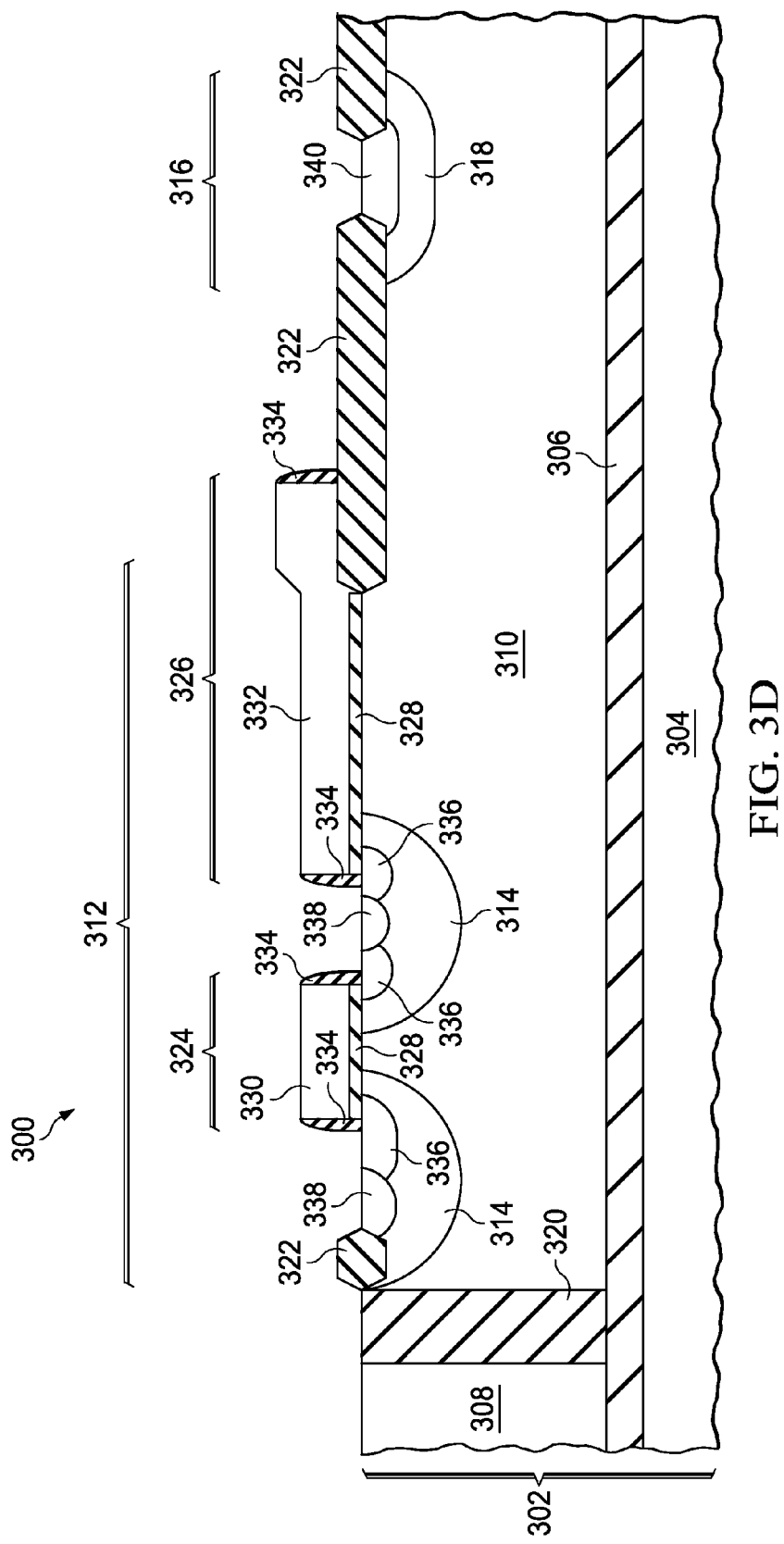

Referring to FIG. 3D, fabrication of the IC (300) continues with formation of n-type MOS source diffused regions (336) at top surfaces of the p-type sinks (314) adjacent to the gate sidewall spacers (334), typically by ion implanting a third set of n-type Still referring to FIG. 3D, p-type source contact regions (338) are formed at top surfaces of the p-type sinks (314) adjacent to the n-type MOS source diffused regions (336), typically by ion implanting a second set of p-type dopants, such as boron, $BF_2$ and/or gallium, typically at energies between 30 and 300 keV, typically at total doses from $3 \cdot 10^{13}$ to $3 \cdot 10^{16}$ cm$^{-2}$. Similarly, one or more p-type drain contact regions (340) is formed at a top surface of the n-type buffer (318) in an open region surrounded by field oxide (322), typically by ion implanting a second set of p-type dopants, such as boron, $BF_2$ and/or gallium, typically at energies between 30 and 300 keV, typically at total doses from $3 \cdot 10^{13}$ to $3 \cdot 10^{16}$ cm$^{-2}$. It is common to form the p-type source contact regions (338) and the p-type drain contact regions (340) in the same set of process steps.

It is within the scope of this invention to vary the order of formation of the of n-type MOS source diffused regions (336), the p-type source contact regions (338) and the p-type drain contact regions (340).

Figure 3E:
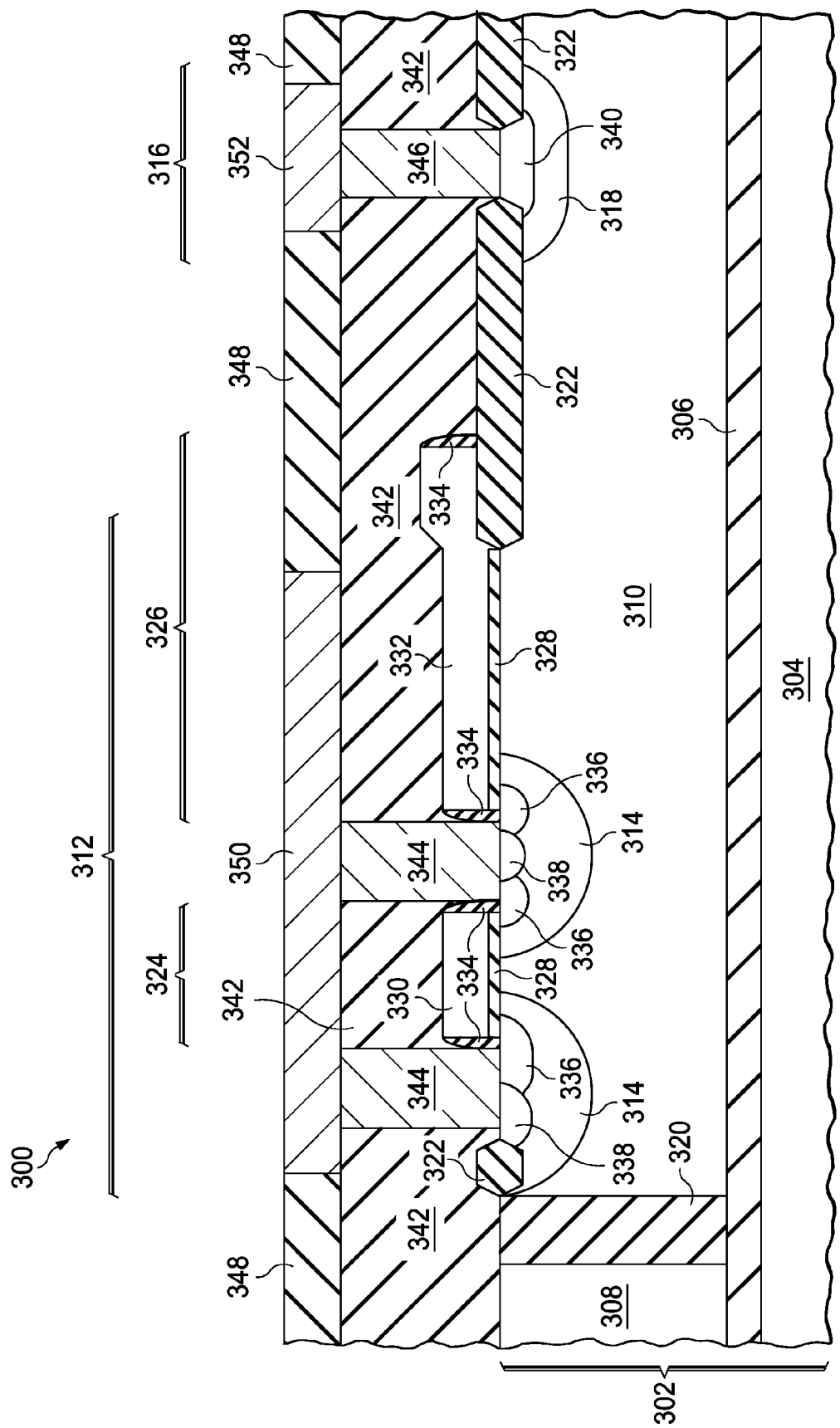

Referring to FIG. 3E, following formation of the n-type MOS source diffused regions (336), the p-type source contact regions (338) and the p-type drain contact regions (340), fabrication of the IC (300) continues with formation of elements of a system of interconnects that provide electrical connections between the L-IGBT and other components in the IC (300). A pre-metal dielectric (PMD) layer stack (342), which typically includes a PMD liner of silicon nitride, silicon dioxide, silicon oxy-nitride or a combination these materials, between 10 and 100 nanometers thick, a silicon dioxide, PSG or BPSG layer between 400 and 1000 nanometers thick, is formed on the top surface of the n-type well (300), p-type sinks (314), n-type buffer (318) and field oxide (322). Metal contacts are formed in the PMD layer stack (342) and extend from a top surface of the PMD layer stack (342) to contact regions in the L-IGBT. Contacts are formed by defining regions for contacts with a second photoresist pattern, forming contact holes by removing PMD layer stack (342) material by known etching methods to expose the top surface of the contact regions of the L-IGBT, and depositing a metal or metals, commonly platinum, tungsten, titanium-tungsten and/or aluminum, in the contact holes and on the top surface of the PMD layer stack (342), followed by selective removal of the metals from the top surface of the PMD layer stack (342), commonly by etching and/or CMP. In this manner, source contacts (344) are formed that make electrical connections to the n-type MOS source diffused regions (336) and the p-type source contact regions (338). Similarly, drain contacts (346) are formed that make electrical connections to the p-type drain contact regions (340). Gate contacts, not shown in FIG. 1E, are formed that make electrical connections to the MOS gates (330, 232).

Still referring to FIG. 3E, a first set of metal interconnects and a first intra-metal dielectric layer (348) is formed on a top surface of the PMD layer stack (342). The first intra-metal dielectric layer (348) may be formed primarily of silicon dioxide, fluoro-silicate glass (FSG), or any of several dielectric materials with a lower dielectric constant than silicon dioxide, such as OSG, carbon-doped silicon oxides (SiCO or CDO) or MSQ, collectively known as low-k dielectrics. The first set of metal interconnects may be formed of aluminum or copper. A source metal lead (350) makes electrical contact to the top surfaces of the source contacts (344). Similarly, a drain metal lead (352) makes electrical contact to the top surfaces of the drain contacts (346). A gate metal lead, not shown in FIG. 3E, makes electrical contact to the top surfaces of the gate contacts.

The p-type drain contact regions (340) form an emitter of a PNP bipolar transistor, hereafter referred to simply as the emitter, the n-type well (310) forms a base of the PNP bipolar transistor, hereafter referred to simply as the base, and the p-type source contact regions (338) form a collector of the PNP bipolar transistor, hereafter referred to simply as the collector. The n-type MOS source diffused regions (336) form sources of two parallel NMOS transistors under MOS gate (330), which is referred to as a dual channel MOS gate, and a source of a single channel NMOS transistor under the MOS gate (332), which is referred to as a single channel MOS gate. The n-type MOS source diffused regions (336), the dual channel MOS gate (330) and the single channel MOS gate (332), and regions the n-type well (310) under the MOS gates (330, 232) adjacent to the p-type sinks (314) form drains of three parallel NMOS transistors, which are connected to the base.

During operation of the L-IGBT, a positive emitter voltage is applied to the emitter through the drain metal lead (352) with respect to the collector. Gate voltages above an NMOS threshold voltage allow base current to flow through the NMOS transistors, which modulates collector current between the drain metal lead (352) and the source metal lead (350), which is connected to the collector.

The formation of more than one MOS gate in the instant embodiment is advantageous because more base current is provided to the PNP bipolar transistor, which provides more collector current density, than L-IGBT configurations with one MOS gate. The configuration of the instant embodiment in which one of the NMOS transistors is a single channel MOS transistor is advantageous because it provides a higher ratio of base current to area of the L-IGBT than other configurations.

Furthermore, the formation of the n-type well (310) such that it extends throughout a majority of the single crystal SOI film (308) in the region defined for the L-IGBT is advantageous because it provides a reduced voltage drop for collector current in the base compared to L-IGBT configurations with more constricted base regions.

Figure 4:
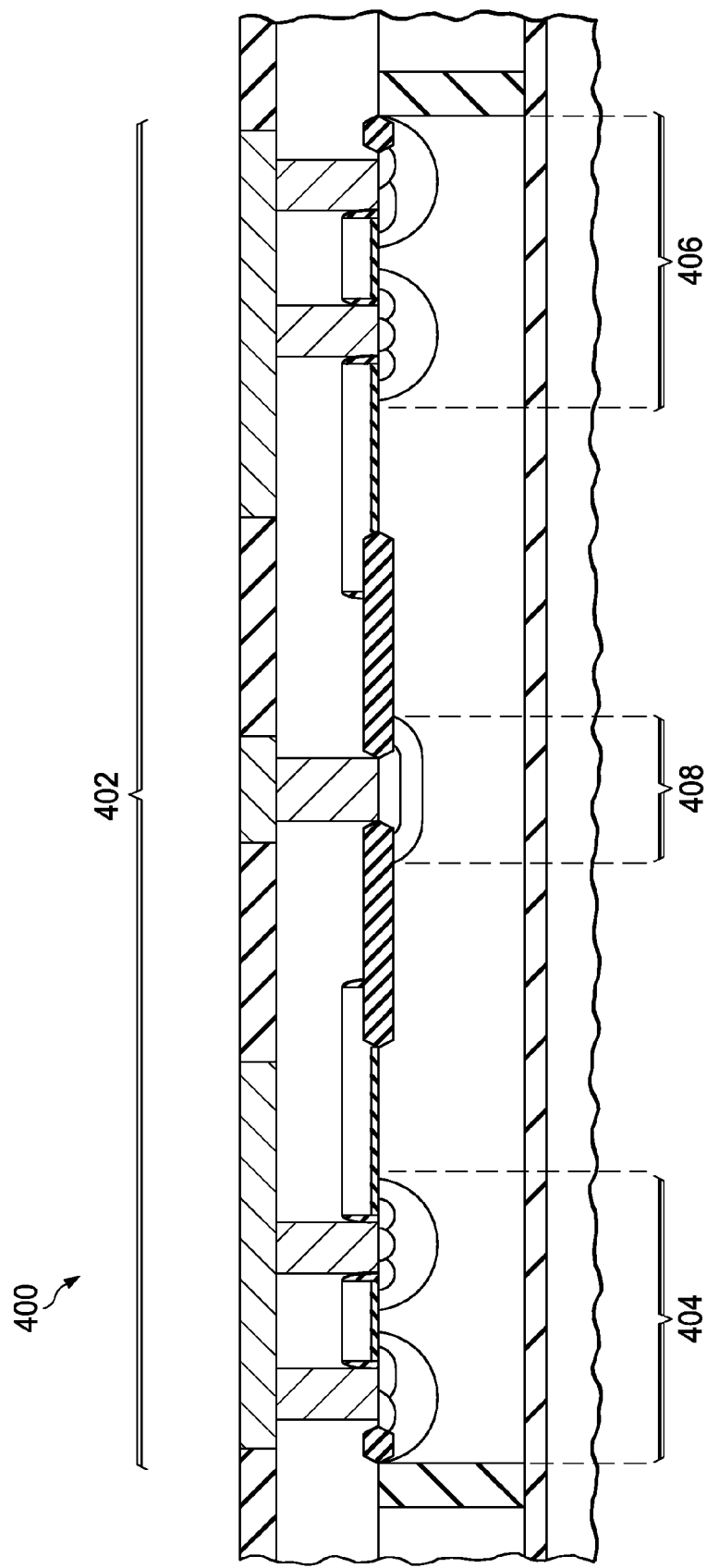
FIG. 4 depicts another symmetric embodiment of the instant invention.

In a further embodiment, another symmetric L-IGBT is formed, as shown in FIG. 4, with source areas on each side of the drain area, so that the L-IGBT is symmetric with respect to the drain area. Referring to FIG. 4, an IC (400) includes an L-IGBT (402), which contains a left source area (404) and a right source area (406) and a central drain area (408). Elements in the left and right source areas (404, 406) correspond to elements in the source area discussed in reference to FIG. 3A through FIG. 3E above. Similarly, elements in the drain area (408) correspond to elements in the drain area discussed in reference to FIG. 3A through FIG. 3E above.

Figure 5A:
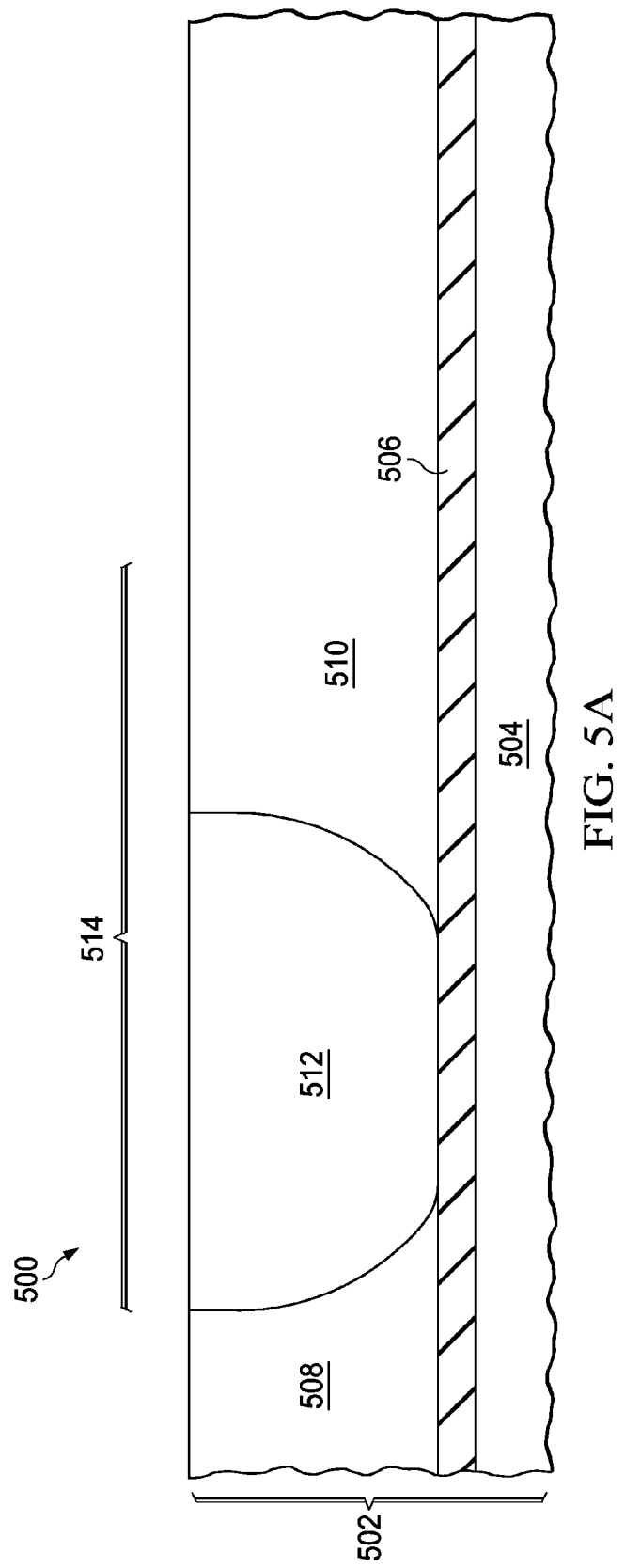
FIG. 5A through FIG. 5C depict an IC, in successive stages of fabrication, containing an L-IGBT formed according to a further embodiment of the instant invention.
Figure 5B:
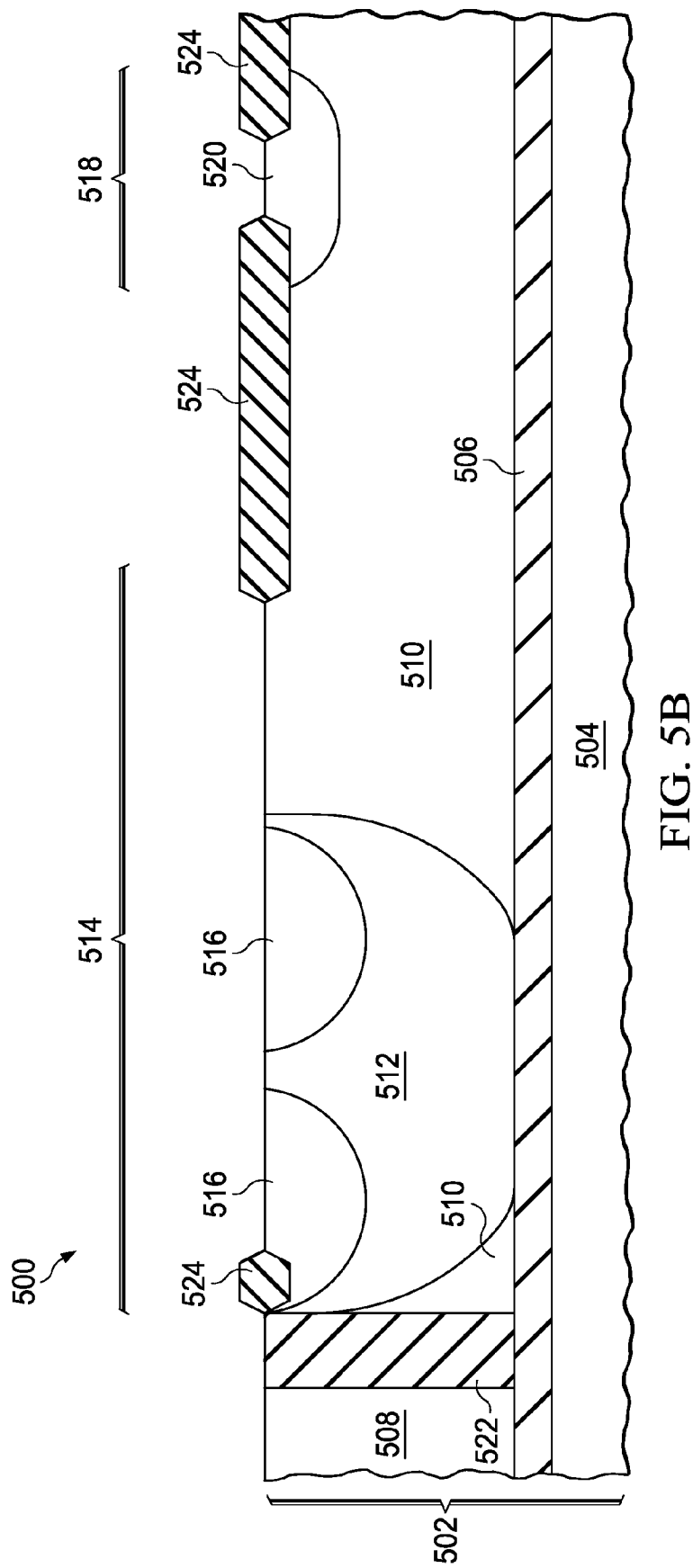
Figure 5C:
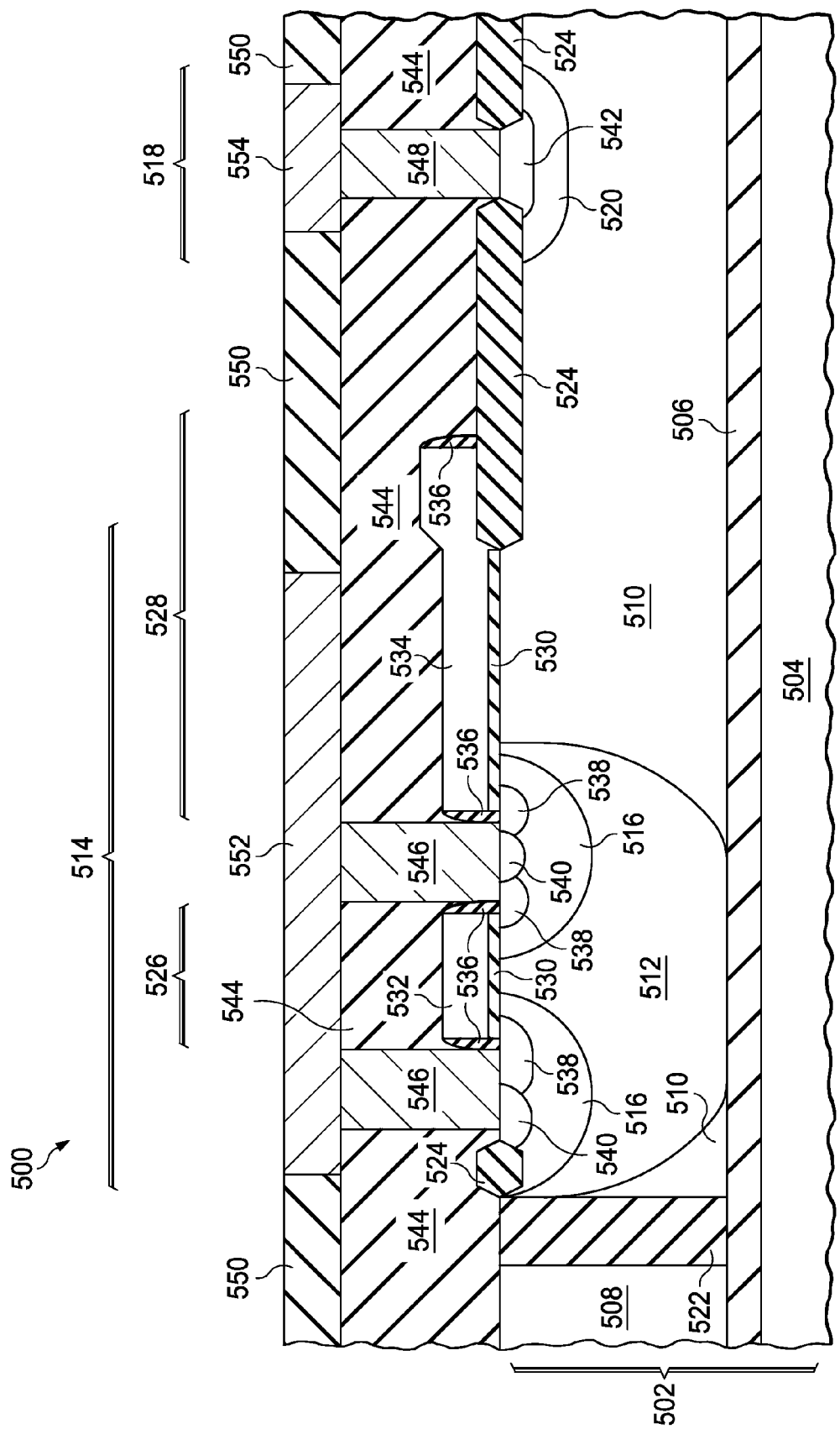

The embodiments discussed in reference to FIG. 1A through FIG. 1E, FIG. 2, and FIG. 3A through FIG. 3E may be enhanced by the addition of n-type buffers surrounding the p-sinks in the source area of the L-IGBTs. FIG. 5A through FIG. 5C depict an IC, in successive stages of fabrication, containing an L-IGBT formed according to a further embodiment of the instant invention. The instant embodiment includes an n-type buffer region as described above. Referring to FIG. 5A, the IC (500) is fabricated on a commercially available starting wafer (502), which includes a support wafer (504) which is commonly single crystal p-type silicon with an electrical resistivity above 50 ohm-cm, a buried oxide layer (506) which is typically silicon dioxide between 0.1 and 2 microns thick, formed on a top surface of the support wafer (504), and a single crystal silicon on insulator (SOI) film (508), typically silicon, commonly 50 nanometers to 10 microns thick, frequently p-type with an electrical resistivity between 1 and 100 ohm-cm, formed on a top surface of the buried oxide layer (506). It is common to grow single crystal silicon or silicon-germanium on a top surface of the single crystal SOI film (508) by epitaxial processes before fabricating components of the IC (500). In another embodiment, the starting wafer (502) may be a monolithic single crystal wafer. A region in the IC (500) defined for the L-IGBT is ion implanted with a first set of n-type dopants such as phosphorus and/or arsenic, typically at energies between 30 and 500 keV, typically at doses from $1 \cdot 10^{11}$ to $3 \cdot 10^{13}$ cm$^{-2}$, and annealed to form an n-type well (510) extending from a top surface of the single crystal SOI film (508) toward the buried oxide layer (506). In a preferred embodiment, the n-type well (510) extends to a top surface of the buried oxide layer (506).

Still referring to FIG. 5A, an n-type buffer region (512) is formed in a source area (514) of the L-IGBT by ion implanting a second set of n-type dopants, such as phosphorus and/or arsenic, typically at energies between 30 and 500 keV, typically at doses from $1 \cdot 10^{11}$ to $1 \cdot 10^{14}$ cm$^{-2}$.

Referring to FIG. 5B, fabrication of the IC (500) proceeds in a similar manner as the embodiments discussed in reference to FIG. 1A through FIG. 1E and FIG. 3A through FIG. 3E. Regions identified for p-type sinks in the source area (514) are ion implanted with a first set of p-type dopants such as boron and/or gallium, typically at energies between 10 and 200 keV, typically at doses from $3 \cdot 10^{12}$ to $1 \cdot 10^{15}$ cm$^{-2}$, and annealed to form p-type sinks (516) in the n-type well (510) extending from the top surface of the single crystal SOI film (508).

Still referring to FIG. 5B, a region identified for an n-type buffer in a drain area (518) of the L-IGBT is ion implanted with a third set of n-type dopants, such as phosphorus, arsenic and/or antimony, typically at energies between 30 and 500 keV, typically at doses from $1 \cdot 10^{13}$ to $5 \cdot 10^{15}$ cm$^{-2}$, and annealed to form an n-type buffer (520) in the n-type well (510) extending from the top surface of the single crystal SOI film (508).

In a preferred embodiment, there is another source area, not shown in FIG. 5B and FIG. 5C for clarity, on the other side of the drain area, so that the L-IGBT is symmetric with respect to the drain area.

It is within the scope of the instant invention to vary the order of formation of the p-type sinks (516) and the n-type buffer (520).

Referring to FIG. 5B, fabrication of the IC (500) continues with formation of elements of deep trench isolation (522) which extend from the top surface of the single crystal SOI film (508) to the buried oxide layer (506), and contain silicon dioxide, to provide electrical isolation between components in the single crystal SOI film (508). Deep trench isolation (522) is formed by etching a region of the single crystal SOI film (508) to expose the buried oxide layer (504) and depositing silicon dioxide in the etched region, according to known methods such as HARP.

Still referring to FIG. 5B, regions of field oxide (524) are formed at the top surface of the single crystal SOI film (508) to provide electrical isolation between elements in the L-IGBT. Field oxide is formed of silicon dioxide, typically 200 to 600 nanometers thick, by known methods such as local oxidation of silicon (LOCOS) or shallow trench isolation (STI).

Referring to FIG. 5C, fabrication of the IC (500) continues with formation of a dual channel MOS gate structure (526) and a single channel MOS gate structure (528) on a top surface of the single crystal SOI film (508) in the source area (514) of the L-IGBT. Formation of the MOS gate structures (526, 328) proceeds by formation of a gate dielectric layer (530), typically silicon dioxide, nitrogen doped silicon dioxide, silicon oxy-nitride, hafnium oxide, layers of silicon dioxide and silicon nitride, or other insulating material, commonly 5 to 100 nanometers thick, on a top surface of the single crystal SOI film (508) over regions adjacent to the p-type sinks (516) and overlapping portions of the p-type sinks (516). Gate material, typically polysilicon between 100 and 1000 nanometers thick, is formed on a top surface of the gate dielectric layer (530). Regions for the dual channel MOS gate (532) and the single channel MOS gate (534) are defined on a top surface of the gate material by a first photoresist pattern, and unwanted gate material is removed by etching to form the MOS gates (532, 334). Typically, gate sidewall spacers (536) are formed on lateral surfaces of the MOS gates (532, 334) to provide lateral separation of MOS source diffused regions from the MOS gates (532, 334). The gate sidewall spacers (536) are commonly formed by depositing between 50 and 500 nanometers of one or more sidewall dielectric materials such as silicon dioxide and silicon nitride on the MOS gates (532, 334) followed by an anisotropic etch which removes the sidewall dielectric materials from a top surface of the MOS gates (532, 334) and the top surface of the single crystal SOI film (508), leaving sidewall dielectric materials on the lateral surfaces of the MOS gates (532, 334) to form the gate sidewall spacers (536), which are typically 20 to 500 nanometers thick.

Continuing to refer to FIG. 5C, fabrication of the IC (500) continues with formation of n-type MOS source diffused regions (538) at top surfaces of the p-type sinks (516) adjacent to the gate sidewall spacers (536), typically by ion implanting a fourth set of n-type dopants, such as phosphorus, arsenic and/or antimony, typically at energies between 50 and 250 keV, typically at total doses from $3 \cdot 10^{13}$ to $3 \cdot 10^{16}$ cm$^{-2}$.

Still referring to FIG. 5C, p-type source contact regions (540) are formed at top surfaces of the p-type sinks (516) adjacent to the n-type MOS source diffused regions (538), typically by ion implanting a second set of p-type dopants, such as boron, BF$_2$ and/or gallium, typically at energies between 30 and 300 keV, typically at total doses from $3 \cdot 10^{13}$ to $3 \cdot 10^{16}$ cm$^{-2}$. Similarly, one or more p-type drain contact regions (542) is formed at a top surface of the n-type buffer (520) in an open region surrounded by field oxide (524), typically by ion implanting a second set of p-type dopants, such as boron, $BF_2$ and/or gallium, typically at energies between 30 and 300 keV, typically at total doses from $3 \cdot 10^{13}$ to $3 \cdot 10^{16}$ cm$^{-2}$. It is common to form the p-type source contact regions (540) and the p-type drain contact regions (542) in the same set of process steps.

It is within the scope of this invention to vary the order of formation of the of n-type MOS source diffused regions (538), the p-type source contact regions (540) and the p-type drain contact regions (542).

Still referring to FIG. 5C, following formation of the n-type MOS source diffused regions (538), the p-type source contact regions (540) and the p-type drain contact regions (542), fabrication of the IC (500) continues with formation of elements of a system of interconnects that provide electrical connections between the L-IGBT and other components in the IC (500). A PMD layer stack (544), which typically includes a PMD liner of silicon nitride, silicon dioxide, silicon oxy-nitride or a combination these materials, between 10 and 100 nanometers thick, a silicon dioxide, PSG or BPSG layer between 400 and 1000 nanometers thick, is formed on the top surface of the n-type well (500), p-type sinks (516), n-type buffer (520) and field oxide (524). Metal contacts are formed in the PMD layer stack (544) and extend from a top surface of the PMD layer stack (544) to contact regions in the L-IGBT. Contacts are formed by defining regions for contacts with a second photoresist pattern, forming contact holes by removing PMD layer stack (544) material by known etching methods to expose the top surface of the contact regions of the L-IGBT, and depositing a metal or metals, commonly platinum, tungsten, titanium-tungsten and/or aluminum, in the contact holes and on the top surface of the PMD layer stack (544), followed by selective removal of the metals from the top surface of the PMD layer stack (544), commonly by etching and/or CMP. In this manner, source contacts (546) are formed that make electrical connections to the n-type MOS source diffused regions (538) and the p-type source contact regions (540). Similarly, drain contacts (548) are formed that make electrical connections to the p-type drain contact regions (542). Gate contacts, not shown in FIG. 5C, are formed that make electrical connections to the MOS gates (532, 334).

Still referring to FIG. 5C, a first set of metal interconnects and a first intra-metal dielectric layer (550) is formed on a top surface of the PMD layer stack (544). The first intra-metal dielectric layer (550) may be formed primarily of silicon dioxide, FSG, or any of several dielectric materials with a lower dielectric constant than silicon dioxide, such as OSG, carbon-doped silicon oxides (SiCO or CDO) or MSQ, collectively known as low-k dielectrics. The first set of metal interconnects may be formed of aluminum or copper. A source metal lead (552) makes electrical contact to the top surfaces of the source contacts (546). Similarly, a drain metal lead (554) makes electrical contact to the top surfaces of the drain contacts (558). A gate metal lead, not shown in FIG. 5C, makes electrical contact to the top surfaces of the gate contacts.

The p-type drain contact regions (542) form an emitter of a PNP bipolar transistor, hereafter referred to simply as the emitter, the n-type well (510) forms a base of the PNP bipolar transistor, hereafter referred to simply as the base, and the p-type source contact regions (540) form a collector of the PNP bipolar transistor, hereafter referred to simply as the collector. The n-type MOS source diffused regions (538) form sources of a dual channel NMOS transistor and a single channel NMOS transistor, the MOS gate (532) forms a gate of the dual channel NMOS transistor and the MOS gate (534) forms a gate of the single channel NMOS transistor, and regions the n-type well (510) under the MOS gates (532, 334) adjacent to the p-type sinks (516) form drains of the NMOS transistors, which are connected to the base.

During operation of the L-IGBT, a positive emitter voltage is applied to the emitter through the drain metal lead (554) with respect to the collector. Gate voltages above an NMOS threshold voltage allow base current to flow through the NMOS transistors, which modulates collector current between the drain metal lead (554) and the source metal lead (552), which is connected to the collector.

The addition of the n-type buffer (512) to the L-IGBT is advantageous because it increases a vertical uniformity of current density in the base of the PNP bipolar transistor, which improves the SOA of the L-IGBT.

Figure 6:
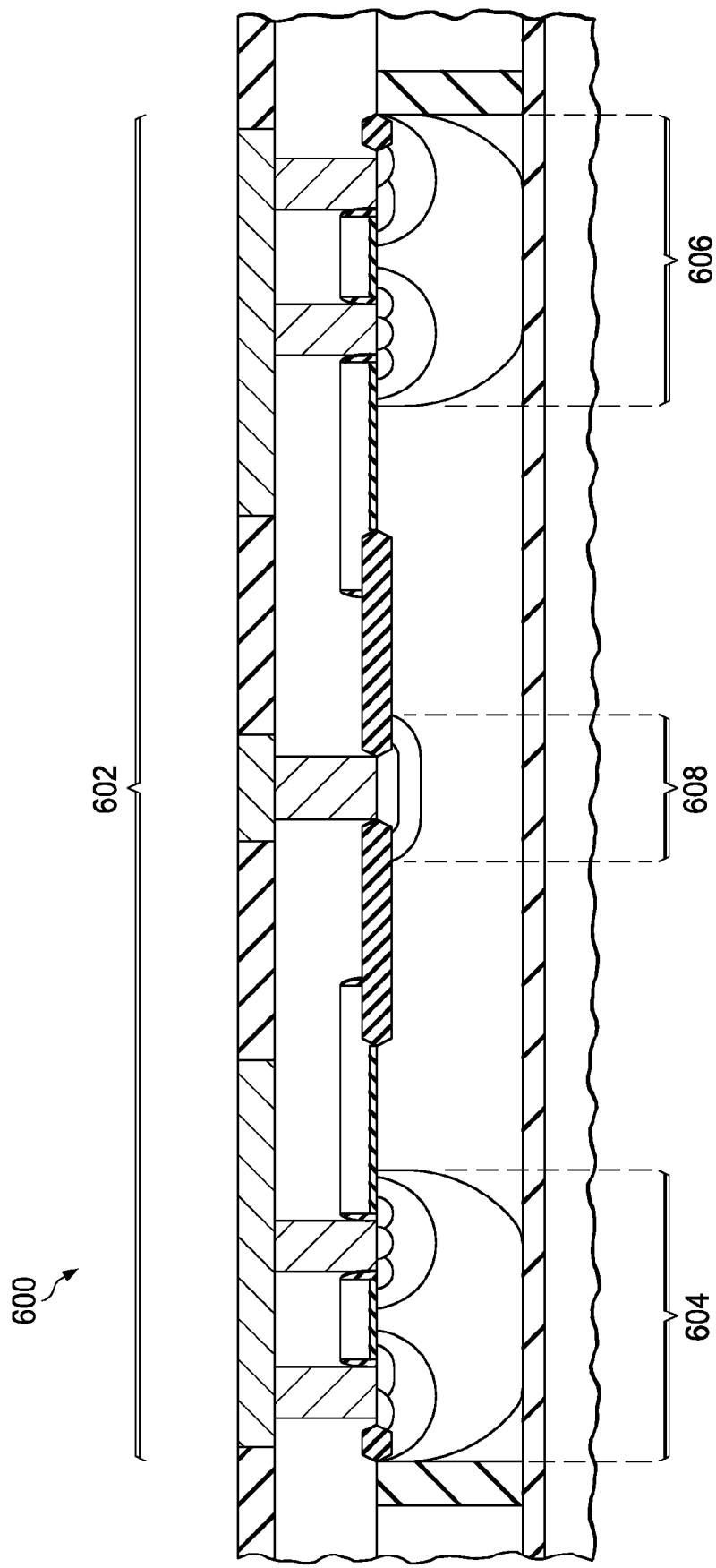
FIG. 6 depicts another symmetric embodiment of the instant invention.

In yet a further embodiment, a symmetric L-IGBT including the elements and configurations of the embodiment discussed in reference to FIG. 5A through FIG. 5C above is formed, as shown in FIG. 6, with source areas on each side of the drain area, so that the L-IGBT is symmetric with respect to the drain area. Referring to FIG. 6, an IC (600) includes an L-IGBT (602), which contains a left source area (604) and a right source area (606) and a central drain area (608). Elements in the left and right source areas (604, 606) correspond to elements in the source area discussed in reference to FIG. 5A through FIG. 5C above. Similarly, elements in the drain area (608) correspond to elements in the drain area discussed in reference to FIG. 5A through FIG. 5C above.

It will be recognized by those familiar with L-IGBTs that the advantages of the embodiments discussed above in reference to FIG. 1A through FIG. 1E, FIG. 2, FIG. 3A through FIG. 3E, FIG. 4, FIG. 5A through FIG. 5C, and FIG. 6 may be realized by a L-IGBT of opposite polarity, that is an L-IGBT including an NPN bipolar transistor with a p-channel MOS (PMOS) transistor connected to a base of the NPN bipolar transistor, by an appropriate change of polarities of the dopants during fabrication.

What is claimed is:

1. A lateral insulated gate bipolar transistor (L-IGBT), comprising:
    a well of a first conductivity type;
    a set of sinks of a second conductivity type formed in a source area in said well on one side of a drain area in said well;
    a first metal oxide semiconductor (MOS) gate formed over a region of said well between a first member of said set of sinks and a second member of said set of sinks, wherein said first MOS gate extends over a portion of said first member of said set of sinks and a portion of said second member of said set of sinks;
    a second MOS gate formed over a region of said well adjacent to second member of said set of sinks, wherein said second MOS gate extends over a portion of said second member of said set of sinks;
    a first MOS source region of said first conductivity type formed in said first member of said set of sinks adjacent to said first MOS gate;
    a second MOS source region of said first conductivity type formed in said second member of said set of sinks adjacent to said first MOS gate;
    a third MOS source region of said first conductivity type formed in said second member of said set of sinks adjacent to said second MOS gate; and a buffer region of said first conductivity type formed in said source area and surrounding said set of sinks, in which a doping density of said buffer region is higher than a doping density of said well.

2. A lateral insulated gate bipolar transistor (L-IGBT), comprising:
a well of a first conductivity type;
a set of sinks of a second conductivity type formed in a source area in said well on one side of a drain area in said well;
a first metal oxide semiconductor (MOS) gate formed over a region of said well between a first member of said set of sinks and a second member of said set of sinks, wherein said first MOS gate extends over a portion of said first member of said set of sinks and a portion of said second member of said set of sinks:
a second MOS gate formed over a region of said well adjacent to second member of said set of sinks, wherein said second MOS gate extends over a portion of said second member of said set of sinks;
a first MOS source region of said first conductivity type formed in said first member of said set of sinks adjacent to said first MOS gate;
a second MOS source region of said first conductivity type formed in said second member of said set of sinks adjacent to said first MOS gate;
a third MOS source region of said first conductivity type formed in said second member of said set of sinks adjacent to said second MOS gate;
a second set of sinks of said second conductivity type formed in a second source area in said well on an opposite side of said drain area from said first source area;
a third MOS gate formed over a region of said well between a first member of said second set of sinks and a second member of said second set of sinks, wherein said third MOS gate extends over a portion of said first member of said second set of sinks and a portion of said second member of said second set of sinks;
a fourth MOS gate formed over a region of said well adjacent to second member of said second set of sinks, wherein said fourth MOS gate extends over a portion of said second member of said second set of sinks;
a fourth MOS source region of said first conductivity type formed in said first member of said second set of sinks adjacent to said third MOS gate;
a fifth MOS source region of said first conductivity type formed in said second member of said second set of sinks adjacent to said third MOS gate; and
a sixth MOS source region of said first conductivity type formed in said second member of said second set of sinks adjacent to said fourth MOS gate.

3. The L-IGBT of claim 2, in which said fourth gate overlaps a portion of a third member of said second set of sinks.

4. The L-IGBT of claim 2, further comprising a second buffer region of said first conductivity type formed in said second source area and surrounding said second set of sinks, in which a doping density of said second buffer region is higher than a doping density of said well.

5. The L-IGBT of claim 2, in which:
said first conductivity type is n-type; and
said second conductivity type is p-type.

6. The L-IGBT of claim 2, in which:
said first conductivity type is p-type; and
said second conductivity type is n-type.

7. An integrated circuit (IC), comprising:
a well of a first conductivity type;
a first set of sinks of a second conductivity type formed in a first source area in said well on one side of a drain area in said well;
a second set of sinks of said second conductivity type formed in a second source area in said well on an opposite side of said drain area from said first source area;
a first MOS gate formed over a region of said well between a first member of said first set of sinks and a second member of said first set of sinks, such that said first MOS gate extends over a portion of said first member of said first set of sinks and a portion of said second member of said first set of sinks;
a second MOS gate formed over a region of said well adjacent to second member of said first set of sinks, such that said second MOS gate extends over a portion of said second member of said first set of sinks;
a first MOS source region of said first conductivity type formed in said first member of said first set of sinks adjacent to said first MOS gate;
a second MOS source region of said first conductivity type formed in said second member of said first set of sinks adjacent to said first MOS gate;
a third MOS source region of said first conductivity type formed in said second member of said first set of sinks adjacent to said second MOS gate;
a third MOS gate formed over a region of said well between a first member of said second set of sinks and a second member of said second set of sinks, such that said third MOS gate extends over a portion of said first member of said second set of sinks and a portion of said second member of said second set of sinks;
a fourth MOS gate formed over a region of said well adjacent to second member of said second set of sinks, such that said fourth MOS gate extends over a portion of said second member of said second set of sinks;
a fourth MOS source region of said first conductivity type formed in said first member of said second set of sinks adjacent to said third MOS gate;
a fifth MOS source region of said first conductivity type formed in said second member of said second set of sinks adjacent to said third MOS gate; and
a sixth MOS source region of said first conductivity type formed in said second member of said second set of sinks adjacent to said fourth MOS gate.

8. The IC of claim 7, in which;
said second MOS gate overlaps a portion of a third member of said first set of sinks; and
said fourth MOS gate overlaps a portion of a third member of said second set of sinks;
and further comprising:
a seventh MOS source region of said first conductivity type formed in said third member of said first set of sinks adjacent to said second MOS gate; and
a eighth MOS source region of said first conductivity type formed in said third member of said second set of sinks adjacent to said fourth MOS gate.

9. The IC of claim 7, further comprising:
a first buffer region of said first conductivity type formed in said first source area and surrounding said first set of sinks, in which a doping density of said first buffer region is higher than a doping density of said well; and
a second buffer region of said first conductivity type formed in said second source area and surrounding said second set of sinks, in which a doping density of said second buffer region is higher than a doping density of said well.

10. The IC of claim 7, in which:
said first conductivity type is n-type; and
said second conductivity type is p-type.

11. The IC of claim 7, in which:
said first conductivity type is p-type; and
said second conductivity type is n-type.

12. The IC of claim 7, further comprising:
a drain contact region of said second conductivity type formed in said drain area;
a first set of source contact regions of said second conductivity type formed in said first set of sinks, such that every member of said first set of sinks contains at least one member of said first set of source contact regions;
a second set of source contact regions of said second conductivity type formed in said second set of sinks, such that every member of said second set of sinks contains at least one member of said second set of source contact regions;
a pre-metal dielectric (PMD) layer formed on a top surface of said drain contact region and top surfaces of said first set of source contact regions, said second set of source contact regions and said first through sixth MOS source regions;
a drain contact formed in said PMD layer which makes an electrical connection to said drain contact region;
a first set of source contacts formed in said PMD layer which make electrical connections to each member of said first set of source contact regions; and
a second set of source contacts formed in said PMD layer which make electrical connections to each member of said second set of source contact regions.

* * * * *